United States Patent
Suga et al.

(10) Patent No.: US 8,409,932 B2
(45) Date of Patent: Apr. 2, 2013

(54) METHOD FOR MANUFACTURING SEMICONDUCTOR DEVICE

(75) Inventors: Yasuhiro Suga, Tochigi (JP); Kazunori Hamazaki, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 250 days.

(21) Appl. No.: 12/734,695

(22) PCT Filed: Oct. 30, 2008

(86) PCT No.: PCT/JP2008/069713
§ 371 (c)(1),
(2), (4) Date: May 18, 2010

(87) PCT Pub. No.: WO2009/122607
PCT Pub. Date: Oct. 8, 2009

(65) Prior Publication Data
US 2010/0308476 A1    Dec. 9, 2010

(30) Foreign Application Priority Data
Apr. 4, 2008   (JP) .................................. 2008-097795

(51) Int. Cl.
*H01L 21/00* (2006.01)
(52) U.S. Cl. ........................................................ 438/127
(58) Field of Classification Search .................... 438/127
See application file for complete search history.

(56) References Cited

U.S. PATENT DOCUMENTS
2007/0254410 A1*  11/2007  Shinoda et al. ............... 438/127
2008/0069957 A1*   3/2008  Sung et al. .................... 427/305

FOREIGN PATENT DOCUMENTS

| CN | 1957452 A | 5/2007 |
|---|---|---|
| JP | A-11-31762 | 2/1999 |
| JP | A-11-307556 | 11/1999 |
| JP | A-2005-340520 | 12/2005 |
| JP | A-2006-303128 | 11/2006 |
| JP | A-2006-344756 | 12/2006 |

OTHER PUBLICATIONS

Chinese Office Action issued in Chinese Patent Application No. 200880128463.9 on Oct. 19, 2011 (with translation).
International Preliminary Report on Patentability issued in International Application No. PCT/JP2008/069713 on Nov. 30, 2010 (with translation).
International Search Report issued in International Application No. PCT/JP2008/069713 on Jan. 20, 2009 (with translation).

(Continued)

*Primary Examiner* — Jae Lee
(74) *Attorney, Agent, or Firm* — Oliff & Berridge, PLC

(57) ABSTRACT

A semiconductor chip is temporarily fixed on a circuit board by having a thermosetting adhesive film in between. A sealing resin film is provided with a mold release film, and a thermosetting sealing resin layer, which is laminated on the mold release film and has a film thickness 0.5 to 2 times the thickness of the semiconductor chip. The sealing resin film is arranged on the semiconductor chip so that the thermosetting sealing resin layer faces the semiconductor chip. Heat is applied to the side of the circuit board, while applying pressure to the sealing resin film from the side of the mold release film by using a rubber head having a rubber hardness of 5-100 to bond the semiconductor chip on the circuit board. After sealing the semiconductor chip with the resin, the mold release film is peeled.

4 Claims, 2 Drawing Sheets

OTHER PUBLICATIONS

Aug. 30, 2011 Office Action issued in Korean Patent Application No. 2010-7014645. (with translation).

Japanese Patent Office, Notification of Reasons for Refusal mailed May 16, 2012 in Japanese Patent Application No. 2008-279024 w/English-language Translation.

Korean Patent Office, Notice of Grounds for Rejection mailed Apr. 30, 2012 in Korean Patent Application No. 2010-7014645 w/English-language Translation.

Nov. 30, 2012 Office Action issued in Korean Patent Application No. 2010-7014645 (with English Translation).

* cited by examiner

METHOD FOR MANUFACTURING SEMICONDUCTOR DEVICE

TECHNICAL FIELD

The present invention relates to a method for manufacturing a semiconductor device in which a semiconductor chip on a circuit substrate is sealed with a resin.

BACKGROUND ART

A two-step method for manufacturing a semiconductor device in which a semiconductor chip on a circuit substrate is sealed with a resin has been proposed (see Patent Document 1). This method comprises: mounting the semiconductor chip on the circuit substrate using an adhesive (a chip-mounting step); and covering the semiconductor chip with a sealing resin sheet and sealing the semiconductor chip using a roller press machine having rigid surfaces or an expensive vacuum press machine, which is not an ordinary bonder (a molding step).

[Patent Document 1] Japanese Patent Application Laid-Open No. 2006-344756.

DISCLOSURE OF THE INVENTION

Problems to be Solved by the Invention

However, with the method proposed in Patent Document 1, since the sealing resin must be heated and pressurized in the molding step, heat and pressure are again applied in the molding step to connection portions formed in the semiconductor chip-mounting step between the circuit substrate and the semiconductor chip. Therefore, damage such as peeling or displacement may occur in the connection portions, and there is a concern that the connection reliability may be reduced. Moreover, the use of expensive apparatus such as the vacuum press machine may increase the manufacturing cost of the semiconductor device.

It is an object of the present invention to manufacture a semiconductor device in which a semiconductor chip on a circuit substrate is sealed with a resin using a relatively simple method that does not cause damage to the connection portions between the circuit substrate and the semiconductor chip due to heat and pressure.

Means for Solving the Problems

The present inventors have made the hypothesis that the above problems can be solved by mounting a semiconductor chip on a circuit substrate and simultaneously sealing the semiconductor chip in a single thermal pressure bonding treatment. The inventors have found that the mounting and sealing of the semiconductor chip can be performed simultaneously by first temporarily bonding the semiconductor chip to the circuit substrate, then covering the semiconductor chip with a sealing resin film having a predetermined thickness, and, with the covered semiconductor chip being pressurized by a rubber head having a rubber hardness in a predetermined range, heating the semiconductor chip from the opposite side. Thus, the invention has been completed.

Accordingly, the present invention provides a method for manufacturing a semiconductor device in which a semiconductor chip on a circuit substrate is sealed with a resin. The method comprises:

temporarily securing the semiconductor chip to the circuit substrate with a thermosetting adhesive film interposed therebetween;

disposing on the temporarily secured semiconductor chip a sealing resin film including a release film and a thermosetting sealing resin layer that is laminated on the release film and has a thickness of 0.5 to 2 times a thickness of the semiconductor chip, the sealing resin film being disposed such that the thermosetting sealing resin layer faces the semiconductor chip;

bonding and securing the semiconductor chip to the circuit substrate and simultaneously sealing the semiconductor chip with the resin by applying heat from a side on which the circuit substrate is disposed while a pressure is applied by a rubber head having a rubber hardness of from 5 to 100 from a side on which the release film is disposed; and peeling off the release film on a front side.

Effects of the Invention

In the method for manufacturing a semiconductor device according to the present invention, the mounting of a semiconductor chip on a circuit substrate and the sealing of the semiconductor chip are performed simultaneously in a single thermal pressure bonding treatment using a sealing resin film including a thermosetting sealing resin layer having a predetermined thickness. Therefore, after the connection, heat and pressure are not applied again to the connection portions formed between the circuit substrate and the semiconductor chip. Accordingly, damage such as peeling or displacement does not occur in the connection portions.

DESCRIPTION OF REFERENCE NUMERALS

| | |
|---|---|
| 1 | circuit substrate |
| 2 | thermosetting adhesive film |
| 3 | semiconductor chip |
| 4 | release film |
| 5 | thermosetting sealing resin layer |
| 6 | sealing resin film |
| 7 | rubber head |
| 8 | heating stage |

BEST MODE FOR CARRYING OUT THE INVENTION

The present invention is a method for manufacturing a semiconductor device in which a semiconductor chip on a circuit substrate is sealed with a resin. The steps of the manufacturing method are described with reference to FIGS. 1A to 1D.

Figure 1A:
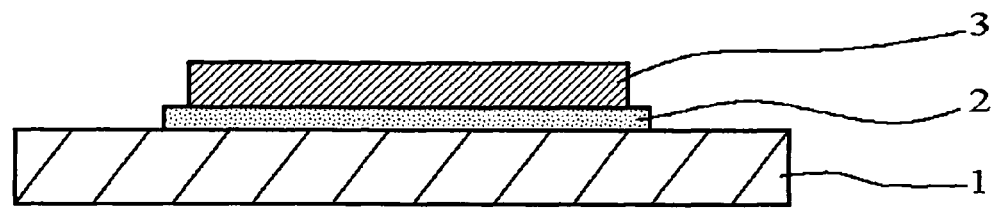
FIG. 1A is a diagram describing a part of the steps of a manufacturing method of the present invention.

First, as shown in FIG. 1A, the semiconductor chip 3 is temporarily secured to the circuit substrate 1 with a thermosetting adhesive film 2 interposed therebetween. More specifically, the thermosetting adhesive film 2 is temporarily applied to the circuit substrate 1 through the adhesive force of the thermosetting adhesive film 2, and the semiconductor chip 3 is temporarily secured thereto.

Any circuit substrate widely used in semiconductor devices, such as a glass epoxy circuit substrate, a glass circuit substrate, or a flexible circuit substrate, may be used as the circuit substrate 1.

Any insulating thermosetting adhesive film commonly used for securing electronic components may be used as the thermosetting adhesive film 2. Preferably, a thermosetting adhesive film composed mainly of an epoxy resin or an acrylic resin is used. Preferably, the thermosetting adhesive film 2 contains an imidazole-based latent curing agent in an amount of from 20 to 50 percent by mass based on the solid content. Any known additive may be added to the thermosetting adhesive film 2. In particular, to control the linear expansion coefficient of the thermosetting adhesive film 2, fine-particle silica is preferably added thereto in an amount of from 10 to 60 percent by mass based on the solid content. The thickness of the thermosetting adhesive film 2 is typically in the range of from 40 to 50 μm.

A semiconductor chip with performance suitable for the application of the semiconductor device is used as the semiconductor chip 3. For example, a semiconductor chip suitable for a CPU, ROM, RAM, LED, or the like is selected based on its application. Examples of the method for electrically connecting the semiconductor chip 3 to the circuit substrate 1 include: flip-chip bonding using bumps formed on the rear face of the semiconductor chip 3; and flip-chip bonding using solder balls interposed between the semiconductor chip 3 and the connection terminals of the circuit substrate 1.

Figure 1B:
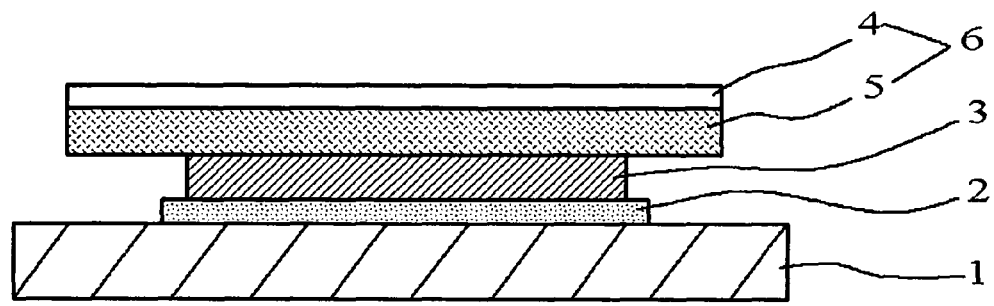
FIG. 1B is a diagram describing a part of the steps of the manufacturing method of the present invention.

Next, as shown in FIG. 1B, a sealing resin film 6 including a release film 4 and a thermosetting sealing resin layer 5 laminated thereon is disposed on the temporarily secured semiconductor chip 3 such that the thermosetting sealing resin layer 5 faces the semiconductor chip 3.

Any known release film, such as a polyethylene terephthalate (PET) film, having a surface subjected to releasable treatment may be used as the release film 4 of the sealing resin film 6. No particular limitation is imposed on the thickness of the release film 4. The thickness of the release film 4 is typically in the range of from 40 to 60 μm. Any known thermosetting sealing resin may be used for the thermosetting sealing resin layer 5. Preferably, a resin composed mainly of an epoxy resin or an acrylic resin may be used. The thermosetting sealing resin contains an imidazole-based latent curing agent in an amount of preferably from 20 to 50 percent by mass. Any known additive may be added to the thermosetting sealing resin layer 5. In particular, to control the linear expansion coefficient of the thermosetting sealing resin layer 5, fine-particle silica is preferably added thereto in an amount of from 10 to 60 percent by mass based on the solid content.

The thickness of the thermosetting sealing resin layer 5 is typically in the range of from 50 to 500 μm. When the thickness of the thermosetting sealing resin layer 5 is much less than the thickness of the semiconductor chip 3, the semiconductor chip 3 may not be sufficiently sealed and may be exposed. When the thickness of the thermosetting sealing resin layer 5 is too large, sufficient pressurization may not be achieved, so that the connection reliability may be insufficient. Therefore, in the present invention, the thickness of the thermosetting sealing resin layer 5 is 0.3 to 2 times, preferably 1 to 2 times, the thickness of the semiconductor chip 3 to be sealed.

Preferably, the following inequalities (1) and (2) are satisfied where Ae is a linear expansion coefficient of the thermosetting sealing resin layer 5 of the sealing resin film 6, Am is an elastic modulus of the thermosetting sealing resin layer 5, Be is a linear expansion coefficient of the thermosetting adhesive film 2, and Bm is an elastic modulus of the thermosetting adhesive film 2.

$$0 < Be/Ae \leq 2.25, \text{ and} \tag{1}$$

$$0 < Am/Bm \leq 3.5 \tag{2}$$

When the value of "Be/Ae" in the inequality (1) is too small, initial continuity failure may occur. When the value is too large, the electrical continuity may not be reliably maintained. Therefore, the value of "Be/Ae" is preferably greater than 0 and 2.25 or less and more preferably 0.3 or more and 2 or less.

When the value of "Am/Bm" in the inequality (2) is too small, initial continuity failure may occur. When the value is too large, the electrical continuity may not be reliably maintained. Therefore, the value of "Am/Bm" is preferably greater than 0 and 3.5 or less and more preferably 0.2 or more and 1 or less.

When the linear expansion coefficient and the elastic modulus of the thermosetting sealing resin layer 5 are compared with those of the thermosetting adhesive film 2, the values at their grass transition temperatures or less should be compared. This is because the temperature in the normal use environment is in the room temperature range. Moreover, it is preferable that the results of the comparisons of the values above their grass transition temperatures satisfy the relationships expressed by the inequalities (1) and (2). This is because if post-processing is performed on the component, an additional heat history is added thereto.

Figure 1C:
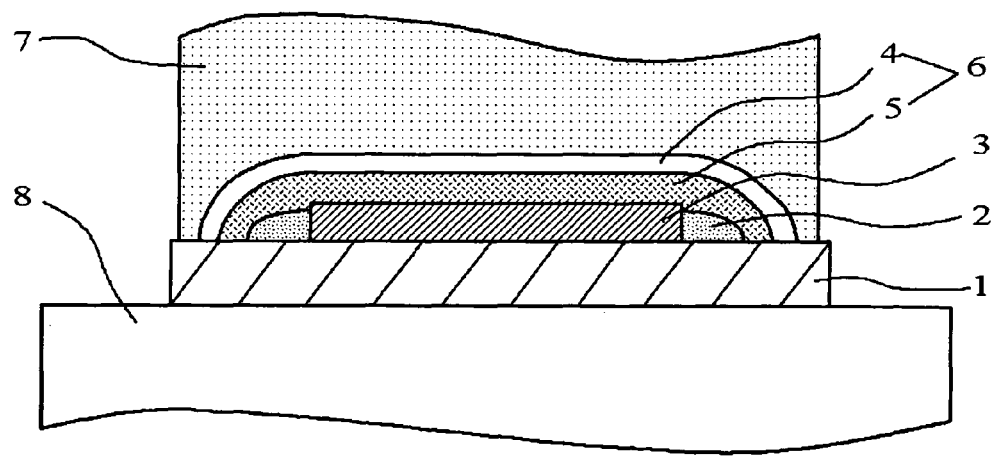
FIG. 1C is a diagram describing a part of the steps of the manufacturing method of the present invention.

Next, as shown in FIG. 1C, heat is applied from the circuit substrate 1 side by a heating stage 8 while pressure is applied from the release film 4 side by a rubber head 7. In this manner, the semiconductor chip 3 is bonded and secured to the circuit substrate 1, and simultaneously the semiconductor chip 3 is sealed with the resin.

The rubber head 7 includes a contact portion coming into contact with a target to be pressurized, and this contact portion must be formed of a rubber that can pressurize the target while deformed so as to follow the complex irregular surface shape of the target. Specifically, the contact portion is composed of a resin having a rubber hardness (JIS S6050) of preferably from 5 to 100 and more preferably from 40 to 80. Examples of the resin having such a rubber hardness include silicone resins and fluorine-based resins. These resins are preferred because of their high thermal resistance. The pressing pressure is typically in the range of from 1 to 3 MPa.

Preferably, the heating stage 8 is formed of a material, such as stainless steel or ceramic, having high heat conductivity and capable of being heated to typically 300° C. The temperature of the heating stage 8 is set such that the thermosetting adhesive film 2 and the sealing resin film 6 are heated to typically from 160 to 200° C.

Figure 1D:
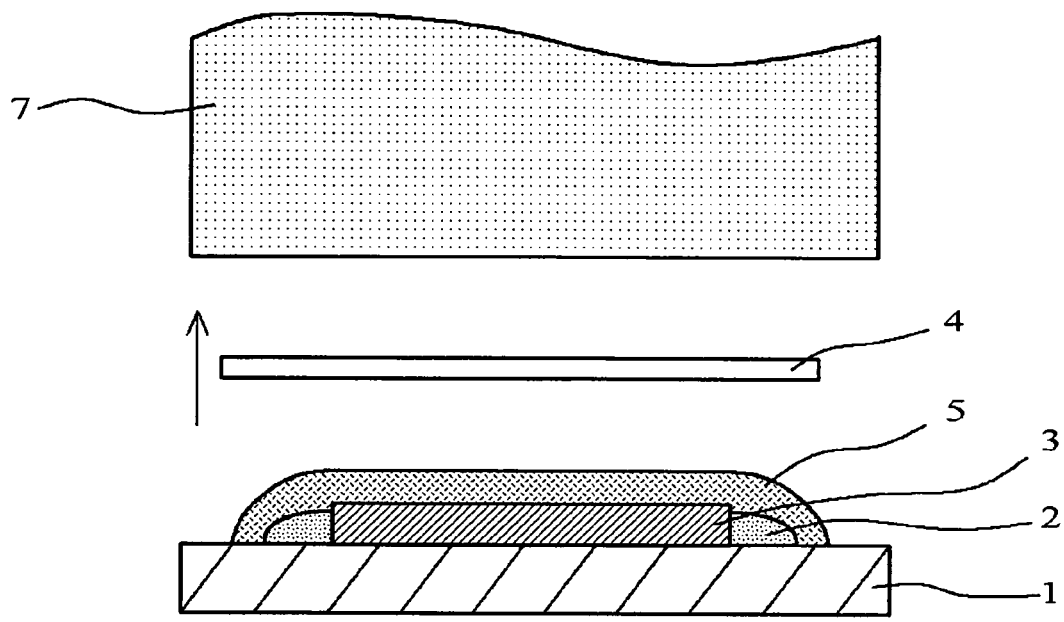
FIG. 1D is a diagram describing a part of the steps of the manufacturing method of the present invention.

Next, as shown in FIG. 1D, the rubber head 7 is raised, and the release film 4 is peeled off. In this manner, the securing of the semiconductor chip 3 to the circuit substrate 1 and the sealing of the semiconductor chip 3 can be performed simultaneously. Accordingly, a semiconductor device in which the semiconductor chip 3 connected to the circuit substrate 1 is sealed with the resin can be obtained. It should be noted that in FIGS. 1C and 1D, the thermosetting sealing resin layer 5 and the thermosetting adhesive film 2 are already cured.

EXAMPLES

Hereinafter, the present invention will be specifically described by way of Examples. In the following Examples and Comparative Examples, a glass epoxy circuit substrate was used as an evaluation circuit substrate. The glass epoxy circuit substrate has dimensions of 0.3 mm×38 mm×38 mm and includes Ni—Au—plated copper traces 12 μm thick formed on the surface thereof. A silicon chip having dimensions of 200 μm×6.3 mm×6.3 mm and including gold stud bumps (160 pins) was used as an evaluation semiconductor chip.

Reference Example 1

Preparation of Thermosetting Adhesive Film A

A mixture of 50 parts by mass of an epoxy resin (jER828, Japan Epoxy Resins Co., Ltd.), 100 parts by mass of a latent curing agent (HX3941HP, Asahi Kasei Chemicals Corporation), and 50 parts by mass of fine-particle silica (Tatsumori Ltd.) was dissolved and dispersed in toluene such that the solid content was 50 percent by mass, whereby a thermosetting adhesive composition was obtained. The obtained thermosetting adhesive composition was applied to a 50 μm-thick polyethylene terephthalate (PET) film (Tohcello Co., Ltd.) subjected to releasable treatment to a dry thickness of 45 μm and was dried at 80° C. to prepare a thermosetting adhesive film A. The elastic modulus Bm of the film A was 5 GPa. The linear expansion coefficient Be1 of the film A at a temperature below the glass transition temperature (in the range of 20 to 40° C.) was 30 ppm. The linear expansion coefficient Be2 of the film A at a temperature above the glass transition temperature (in the range of 160 to 190° C.) was 110 ppm.

Reference Example 2

Preparation of Thermosetting Adhesive Film B

The same procedure as in Reference Example 1 was repeated except that the amount of the fine-particle silica added was changed from 50 parts by mass to 30 parts by mass, whereby a thermosetting adhesive film B was prepared. The elastic modulus of the film B was 3.5 GPa. The linear expansion coefficient Be1 of the film B at a temperature below the glass transition temperature (in the range of 20 to 40° C.) was 52 ppm. The linear expansion coefficient Be2 of the film B at a temperature above the glass transition temperature (in the range of 160 to 190° C.) was 145 ppm.

Reference Example 3

Preparation of Thermosetting Adhesive Film C

The same procedure as in Reference Example 1 was repeated except that the amount of the fine-particle silica added was changed from 50 parts by mass to 0 parts by mass, whereby a thermosetting adhesive film C was prepared. The elastic modulus Bm of the film C was 1.6 GPa. The linear expansion coefficient Be1 of the film C at a temperature below the glass transition temperature (in the range of 20 to 40° C.) was 66 ppm. The linear expansion coefficient Be2 of the film C at a temperature above the glass transition temperature (in the range of 160 to 190° C.) was 187 ppm.

Reference Example 4

Preparation of Thermosetting Adhesive Film D

The same procedure as in Reference Example 1 was repeated except that the amount of the fine-particle silica added was changed from 50 parts by mass to 80 parts by mass, whereby a thermosetting adhesive film D was prepared. The elastic modulus Bm of the film D was 8 GPa. The linear expansion coefficient Be1 of the film D at a temperature below the glass transition temperature (in the range of 20 to 40° C.) was 22 ppm. The linear expansion coefficient Be2 of the film D at a temperature above the glass transition temperature (in the range of 160 to 190° C.) was 69 ppm.

Reference Example 5

Preparation of Thermosetting Sealing Resin Film 1

A mixture of 50 parts by mass of an epoxy resin (jER828, Japan Epoxy Resins Co., Ltd.), 100 parts by mass of a latent curing agent (HX3941HP, Asahi Kasei Chemicals Corporation), and 50 parts by mass of fine-particle silica (Tatsumori Ltd.) was dissolved and dispersed in toluene such that the solid content was 50 percent by mass, whereby a thermosetting adhesive composition was obtained. The obtained thermosetting adhesive composition was applied to a 50 μm-thick PET film (Tohcello Co., Ltd.) subjected to releasable treatment to a dry thickness of 50 μm and was dried at 80° C. to prepare a thermosetting sealing resin film 1. The elastic modulus Am of the film 1 was 5 GPa. The linear expansion coefficient Ae1 of the film 1 at a temperature below the glass transition temperature (in the range of 20 to 40° C.) was 30 ppm. The linear expansion coefficient Ae2 of the film 1 at a temperature above the glass transition temperature (in the range of 160 to 190° C.) was 110 ppm.

Reference Example 6

Preparation of Thermosetting Sealing Resin Film 2

The same procedure as in Reference Example 5 was repeated except that the thermosetting adhesive composition was applied to a dry thickness of 100 μm, whereby a thermosetting sealing resin film 2 was prepared. The elastic modulus Am and the linear expansion coefficients Ae1 and Ae2 of the film 2 were the same as those of the thermosetting sealing resin film 1 of Reference Example 5.

Reference Example 7

Preparation of Thermosetting Sealing Resin Film 3

The same procedure as in Reference Example 5 was repeated except that the thermosetting adhesive composition was applied to a dry thickness of 200 μm, whereby a thermosetting sealing resin film 3 was prepared. The elastic modulus Am and the linear expansion coefficients Ae1 and Ae2 of the film 3 were the same as those of the thermosetting sealing resin film 1 of Reference Example 5.

Reference Example 8

Preparation of Thermosetting Sealing Resin Film 4

The same procedure as in Reference Example 0.5 was repeated except that the thermosetting adhesive composition was applied to a dry thickness of 300 μm, whereby a thermosetting sealing resin film 4 was prepared. The elastic modulus Am and the linear expansion coefficients Ae1 and Ae2 of the film 4 were the same as those of the thermosetting sealing resin film 1 of Reference Example 5.

Reference Example 9

Preparation of Thermosetting Sealing Resin Film 5

The same procedure as in Reference Example 5 was repeated except that the thermosetting adhesive composition was applied to a dry thickness of 500 μm, whereby a thermosetting sealing resin film 5 was prepared. The elastic modulus Am and the linear expansion coefficients Ae1 and Ae2 of the film 5 were the same as those of the thermosetting sealing resin film 1 of Reference Example 5.

Reference Example 10

Preparation of Thermosetting Sealing Resin Film 6

The same procedure as in Reference Example 7 was repeated except that the amount of the fine-particle silica added was changed from 50 parts by mass to 0 parts by mass, whereby a thermosetting sealing resin film 6 was prepared. The elastic modulus Am of the film 6 was 1.6 GPa, the linear expansion coefficient Ae1 thereof was 66 ppm, and the linear expansion coefficient Ae2 thereof was 187 ppm.

Example 1

The thermosetting adhesive film A of Reference Example 1 was applied to the evaluation circuit substrate, and the release film was peeled off. The evaluation semiconductor chip was temporarily secured in position on the thermosetting adhesive film A and was covered with the thermosetting sealing resin film 2 of Reference Example 6. Pressing pressure was applied by a silicon rubber head while heat was applied from below, whereby the mounting of the semiconductor chip to the circuit substrate and the sealing of the semiconductor chip were performed simultaneously. Finally, the release film on the front side was peeled off, and a semiconductor device of Example 1 was thereby obtained. The pressing conditions were the temperature of 180° C. with the pressing pressure of 2.5 MPa for 20 seconds.

Example 2

The same procedure as in Example 1 was repeated except that the thermosetting sealing resin film 4 of Reference Example 8 was used instead of the thermosetting sealing resin film 2 of Reference Example 6, whereby a semiconductor device of Example 2 was obtained.

Example 3

The same procedure as in Example 1 was repeated except that the thermosetting adhesive film B of Reference Example 2 was used instead of the thermosetting adhesive film A of Reference Example 1 and that the thermosetting sealing resin film 3 of Reference Example 7 was used instead of the thermosetting sealing resin film 2 of Reference Example 6, whereby a semiconductor device of Example 3 was obtained.

Example 4

The same procedure as in Example 3 was repeated except that the thermosetting adhesive film C of Reference Example 3 was used instead of the thermosetting adhesive film A of Reference Example 1, whereby a semiconductor device of Example 4 was obtained.

Example 5

The same procedure as in Example 1 was repeated except that the thermosetting adhesive film D of Reference Example 4 was used instead of the thermosetting adhesive film A of Reference Example 1 and that the thermosetting sealing resin film 6 of Reference Example 10 was used instead of the thermosetting sealing resin film 2 of Reference Example 6, whereby a semiconductor device of Example 5 was obtained.

Comparative Example 1

The thermosetting adhesive film A of Reference Example 1 was applied to the evaluation circuit substrate, and the release film was peeled off. Then, the semiconductor chip was bonded and mounted to the thus-prepared circuit substrate by applying heat and pressure under the conditions of 180° C. and 2.5 MPa for 20 seconds. Subsequently, the semiconductor chip was potted and sealed with a sealing liquid resin (Panasonic Electric Works Co., Ltd) and was heated in a heat circulating oven at 150° C. for 3 hours, whereby a semiconductor device of Comparative Example 1 was obtained.

Comparative Example 2

The same procedure as in Example 1 was repeated except that the thermosetting sealing resin film 1 of Reference Example 5 was used instead of the thermosetting sealing resin film 2 of Reference Example 6, whereby a semiconductor device of Comparative Example 2 was obtained.

Comparative Example 3

The same procedure as in Example 1 was repeated except that the thermosetting sealing resin film 5 of Reference Example 9 was used instead of the thermosetting sealing resin film 2 of Reference Example 6, whereby a semiconductor device of Comparative Example 3 was obtained.

(Evaluation)

The semiconductor device obtained in each of the Examples and Comparative Examples was measured for the electrical resistance (mΩ) between the circuit substrate and the semiconductor chip by the four-probe method (40 channels/sample) to check the electrical connection. The electrical resistance was measured before a moisture absorption-reflow process (initial) and after the moisture absorption-reflow process (after left to stand at 85° C. and 85% RH for 24 hours, the semiconductor device was subjected to a single solder reflow process at 265° C. (MAX). In addition, the insulation resistance (Ω) was measured by the daisy chain method before the moisture absorption-reflow process (initial) and after the moisture absorption-reflow process (after left to stand at 85° C. and 85% RH for 24 hours, the semiconductor device was subjected to a single solder reflow process at 265° C. (MAX) to check the insulation properties. The results obtained are shown in Table 1. Moreover, the appearance after the moisture absorption-reflow process was visually observed. The results obtained are shown in Table 1.

TABLE 1

|  | Comparative Example 1 | Comparative Example 2 | Example 1 | Example 2 | Comparative Example 3 | Example 3 | Example 4 | Example 5 |
|---|---|---|---|---|---|---|---|---|
| [Sealing resin layer thickness]/[Semiconductor chip thickness] | — | 0.25 | 0.5 | 1.5 | 2.5 | 1 | 1 | 1 |
| Below Tg [Linear expansion coefficient of adhesive film]/[Linear expansion coefficient of Sealing resin layer] | 2.31 | 1 | 1 | 1 | 1 | 1.73 | 2.2 | 0.33 |
| Above Tg [Linear expansion coefficient of adhesive film]/[Linear expansion coefficient of Sealing resin layer] | 2.34 | 1 | 1 | 1 | 1 | 1.32 | 1.7 | 0.37 |
| [Elastic modulus of Sealing resin layer]/[Elastic modulus of Adhesive film] | 4 | 1 | 1 | 1 | 1 | 1.43 | 3.13 | 0.2 |
| Electrical resistance (mΩ) | | | | | | | | |
| Before moisture absorption-reflow process | 19 | 19 | 20 | 20 | Open | 19 | 20 | 20 |
| After moisture absorption-reflow process | Open | 20 | 20 | 20 | Open | 20 | 20 | 20 |
| Insulation resistance (Ω) | | | | | | | | |
| Before moisture absorption-reflow process | $10^{12}$ | $10^{12}$ | $10^{12}$ | $10^{12}$ | $10^{12}$ | $10^{12}$ | $10^{12}$ | $10^{12}$ |
| After moisture absorption-reflow process | $10^{12}$ | $10^{12}$ | $10^{12}$ | $10^{12}$ | $10^{12}$ | $10^{12}$ | $10^{12}$ | $10^{12}$ |
| Appearance | Good | Bad | Good | Good | Good | Good | Good | Good |

As can be seen from Table 1, when the mounting and sealing of the semiconductor chip were performed simultaneously and the thickness of the thermosetting sealing resin layer was in the range of 0.3 to 2 times the thickness of the semiconductor chip, the results of the evaluation of the electrical resistance, insulation resistance, and appearance were good. However, in Comparative Example 1, since the mounting and sealing of the semiconductor device were not performed simultaneously, there was no electrical continuity after the moisture absorption-reflow process. In Comparative Example 2, since the thickness of the thermosetting sealing resin layer was less than 0.3 times the thickness of the semiconductor chip, the semiconductor chip could not be fully sealed. In Comparative Example 3, since the thickness of the thermosetting sealing resin layer exceeded twice the thickness of the semiconductor chip, pressurization was insufficient, so that electrical continuity was not established.

INDUSTRIAL APPLICABILITY

In the method for manufacturing a semiconductor device according to the present invention, the mounting of a semiconductor chip to a circuit substrate and the sealing of the semiconductor chip are preformed simultaneously in a single thermal pressure bonding treatment using a sealing resin film including a thermosetting sealing resin layer having a predetermined thickness. Therefore, after the connection, heat and pressure are not applied again to the connection portions formed between the circuit substrate and the semiconductor chip. This allows a reduction in process time and an improvement in yield. The present invention is useful as a method for manufacturing a semiconductor device.

The invention claimed is:

1. A method for manufacturing a semiconductor device in which a semiconductor chip on a circuit substrate is sealed with a resin, the method comprising:

temporarily securing the semiconductor chip to the circuit substrate with a thermosetting adhesive film interposed therebetween;

disposing on the temporarily secured semiconductor chip a sealing resin film including a release film and a thermosetting sealing resin layer that is laminated on the release film and has a thickness of 0.3 to 2 times a thickness of the semiconductor chip, the sealing resin film being disposed such that the thermosetting sealing resin layer faces the semiconductor chip;

bonding and securing the semiconductor chip to the circuit substrate and simultaneously sealing the semiconductor chip with the resin by applying heat from a side on which the circuit substrate is disposed while a pressure is applied by a rubber head having a rubber hardness of from 5 to 100 from a side on which the release film is disposed; and peeling off the release film on a front side, wherein the following inequalities (1) and (2) are satisfied where Ae is a linear expansion coefficient of the thermosetting sealing resin layer of the sealing resin film, Am is an elastic modulus of the thermosetting sealing resin layer, Be is a linear expansion coefficient of the thermosetting adhesive film, and Bm is an elastic modulus of the thermosetting adhesive film;

$$0 < Be/Ae \leq 2.25, \text{ and} \tag{1}$$

$$0 < Am/Bm \leq 3.5 \tag{2}.$$

2. The manufacturing method according to claim 1, wherein the thermosetting sealing resin layer of the sealing resin film and the adhesive film are composed of an epoxy resin or an acrylic resin.

3. The manufacturing method according to claim 1, wherein the rubber head is composed of a silicone resin.

4. A semiconductor device manufactured by the manufacturing method according to claim 1.

* * * * *